United States Patent [19]

Wittlinger

[11] Patent Number: 5,672,998

[45] Date of Patent: Sep. 30, 1997

[54] CLASS D AMPLIFIER AND METHOD

[75] Inventor: Harold Allen Wittlinger, Pennington, N.J.

[73] Assignee: Harris Corporation, Melbourne, Fla.

[21] Appl. No.: 512,763

[22] Filed: Aug. 9, 1995

[51] Int. Cl.[6] .................................................... H03F 3/38
[52] U.S. Cl. ............................... 330/10; 330/207 A
[58] Field of Search ............................ 330/10, 207 A, 330/251; 381/120, 121

[56] References Cited

U.S. PATENT DOCUMENTS 4,390,849  6/1983  Miskin ..................... 330/251
4,458,208  7/1984  Abe .......................... 330/10
4,968,948  11/1990  Tokuno et al. ............ 330/10

*Primary Examiner*—Steven Mottola
*Attorney, Agent, or Firm*—Rogers & Killeen

[57] ABSTRACT

A Class D (audio) amplifier and method in which an input signal for the amplifier is pulse width modulated outside of the amplifier's feedback loop, and in which the pulse width modulated input signal and a pulsed signal from the feedback loop are summed in the feedback loop and fed back to the amplifier. The removal of the pulse width modulation stage and signal integration stage from the feedback loop improves distortion.

13 Claims, 4 Drawing Sheets

5,672,998

CLASS D AMPLIFIER AND METHOD

BACKGROUND OF THE INVENTION

The present invention relates to amplifiers for audio systems, and more particularly to an improved feedback loop in a Class D amplifier that has less distortion.

Audio signal amplifiers, and more specifically, Class D amplifiers are known and only their feedback portion is of interest herein. A Class D amplifier may include conventional stages utilizing integrated circuit (IC) technology in which the complex driver function for the output bridge may be provided by a single IC, such as the Harris® HIP4080 family of ICs.

A feedback loop for the amplifier typically includes a differential-to-single-ended converter for providing a pulsed sample of the output signal which is then integrated with the audio input signal, and then pulse width modulated to provide an input signal to the amplifier. Thus, the feedback loop is generally defined by the circuits connecting the converter, the integrator, and pulse width modulator. Because the feedback loop includes both integration and pulse width modulation stages, it includes the problems associated therewith.

As used in the following description and claims, "integration" and "integrator" refers to the integration customarily found in the feedback loop of an audio feedback amplifier and not to the integration needed for phase or frequency compensation typically provided by inverters.

For example, and as shown in FIG. 1, it may readily be seen that the output circuit 10 includes a conventional amplifier 11 and two one-half bridge driver circuits for a speaker. The customary output filters associated with the speaker have been omitted from the figure.

The feedback path of the audio output signal from speaker in the output circuit 10 at the terminals 12 and 14 thereof includes a conventional differential-to-single-ended-converter 16 which provides a pulsed output signal. This pulsed signal is integrated in a conventional integrator 18 where it is compared with the audio input signal from the input terminal 20.

The output from the integrator 18 is applied to a comparator or pulse width modulator 22 to which a modulating triangular waveform from the generator 24 is also applied. The modulator 22 thus provides complementary pulse width modulated signals A and B to the output circuit 10.

The integration process carried out in the feedback loop is bandwidth limiting and the performance of Class D amplifiers may be improved by avoiding this problem. The problem arises because the pulsed output from the differential-to-single-ended-converter must be removed from the signal in the feedback loop. This means that there is minimal correction of high frequencies by the feedback loop, thereby increasing distortion of the signal. Moreover, undesired residual signals from the pulse output may be reapplied in the pulse width modulator 22.

It has been found that the amplifier and associated driving circuits may be considered a wideband power amplifier, thereby obviating the need for integration in the feedback loop altogether. The signals fed back to the amplifier may be pulsed signals and the feedback treated accordingly in the amplifier.

It has also been found that the process of converting an input signal to a pulse width modulated signal can approach the ideal with a wideband comparator and a precision triangle waveform generator. Thus, there is no need to feedback around this stage and the pulse width modulation stage may be removed from the feedback loop.

Accordingly, it is an object of the present invention to provide a novel method and pulse width modulated audio amplifier which the distortion problems in the feedback loops is significantly reduced.

It is another object of the present invention to provide a novel method and pulse width modulated audio amplifier in which the feedback loop does not include an integration stage.

It is still another object of the present invention to provide a novel method and pulse width modulated audio amplifier in which the feedback loop does not include a pulse width modulation stage.

It is yet another object of the present invention to provide a novel pulse width modulated audio amplifier and method in which an input signal is pulse width modulated outside of an audio amplifier feedback loop.

It is a further object of the present invention to provide a novel pulse width modulated audio amplifier and method for a digitally generated input signal generated from a source such as a compact disc.

It is a still a further object of the present invention to provide a novel pulse width modulated audio amplifier and method for a dual channel or stereo audio input signal.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

Figure 1:
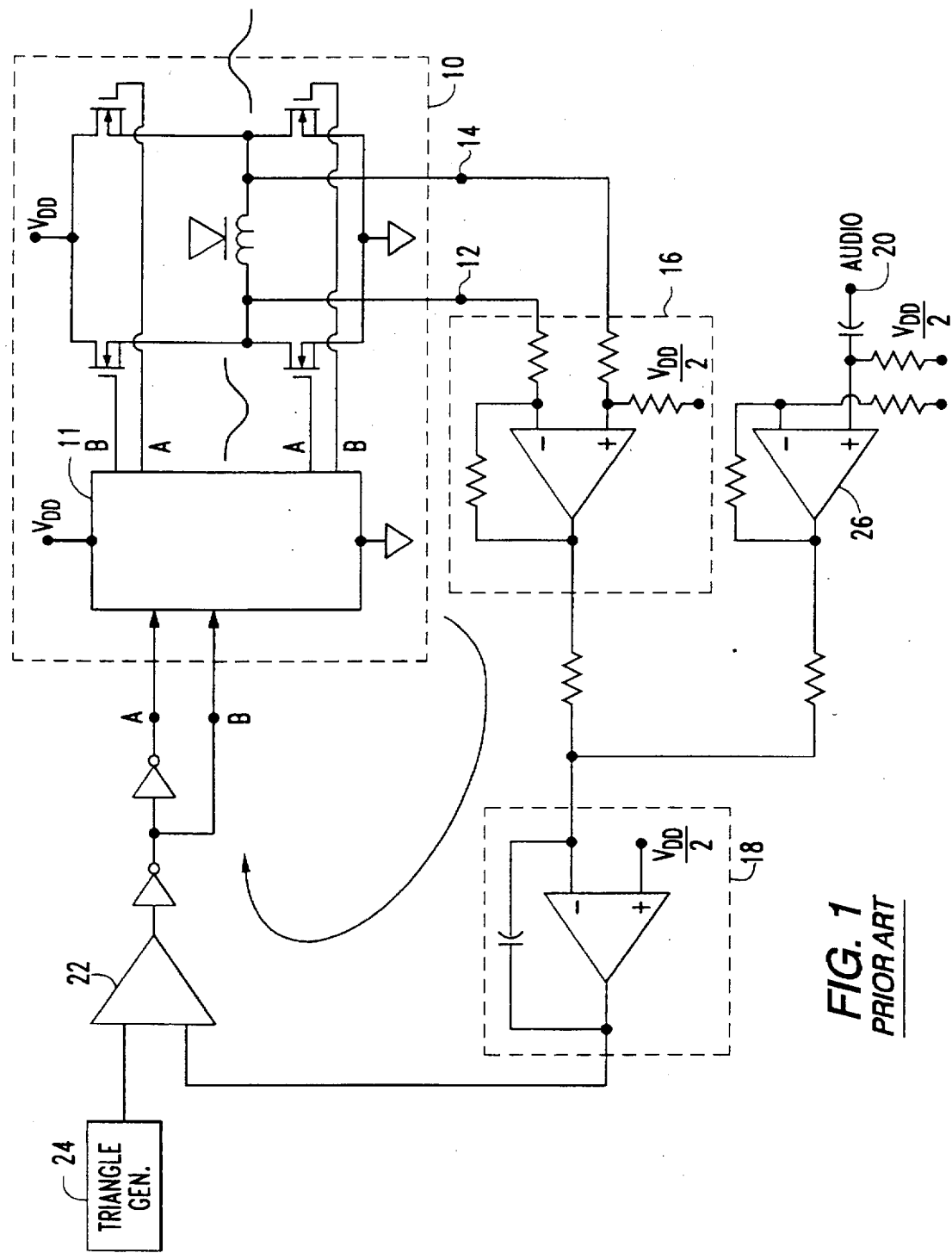
FIG. 1 is a partial circuit and partial block diagram of a Class D amplifier of the prior art.
Figure 2:
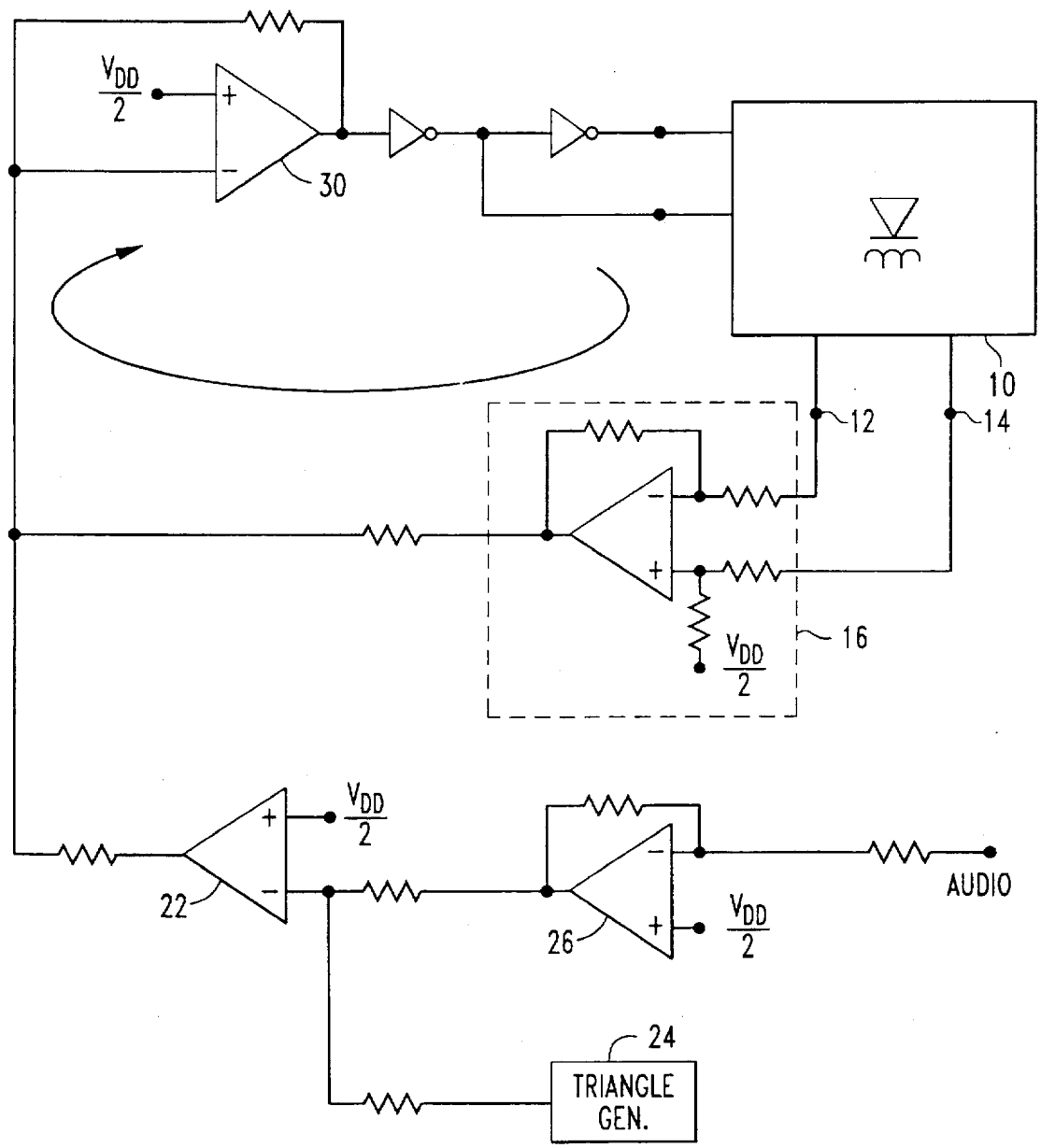
FIG. 2 is a partial circuit and partial block diagram of one embodiment of the amplifier of the present invention.

With reference to the embodiment of FIG. 2 where like circuit elements have been accorded like numerical references to facilitate a comparison with the amplifier of FIG. 1 and an understanding of the present invention, the pulsed feedback signal from the differential-to-single-ended-converter 16 applied to the summing amplifier 30. The pulse width modulated audio input signal from the modulator 22 is also applied to the amplifier 30, and the pulse width modulated output signal therefrom passed through one or more inverters as may be desired for amplification, buffering and proper phasing.

As may readily be seen from FIG. 2, the integrator 18 of Figure has been removed from the feedback loop in this embodiment of the present invention. The removal of the integrator from the feedback loop requires that the audio signal be pulse width modulated for comparison, but this may be accomplished outside of the feedback loop.

Both of the input signals to the summing amplifier 30 may be applied to a single terminal of the amplifier, with a reference voltage being applied to the other input. This avoids common mode input signal swings and the associated error components. As shown in FIG. 2, the input signals to each of the summing amplifier 30, the comparator 22 and the non-inverting amplifier 26 are all applied to a single terminal with a reference voltage applied to the other terminal to thereby improve common mode signal rejection. Because the audio input signal is compared at the input terminal of the comparator 22 with a resistive junction, the comparison is made at the same input signal level and the common mode input voltage range is not exercised.

Figure 3:
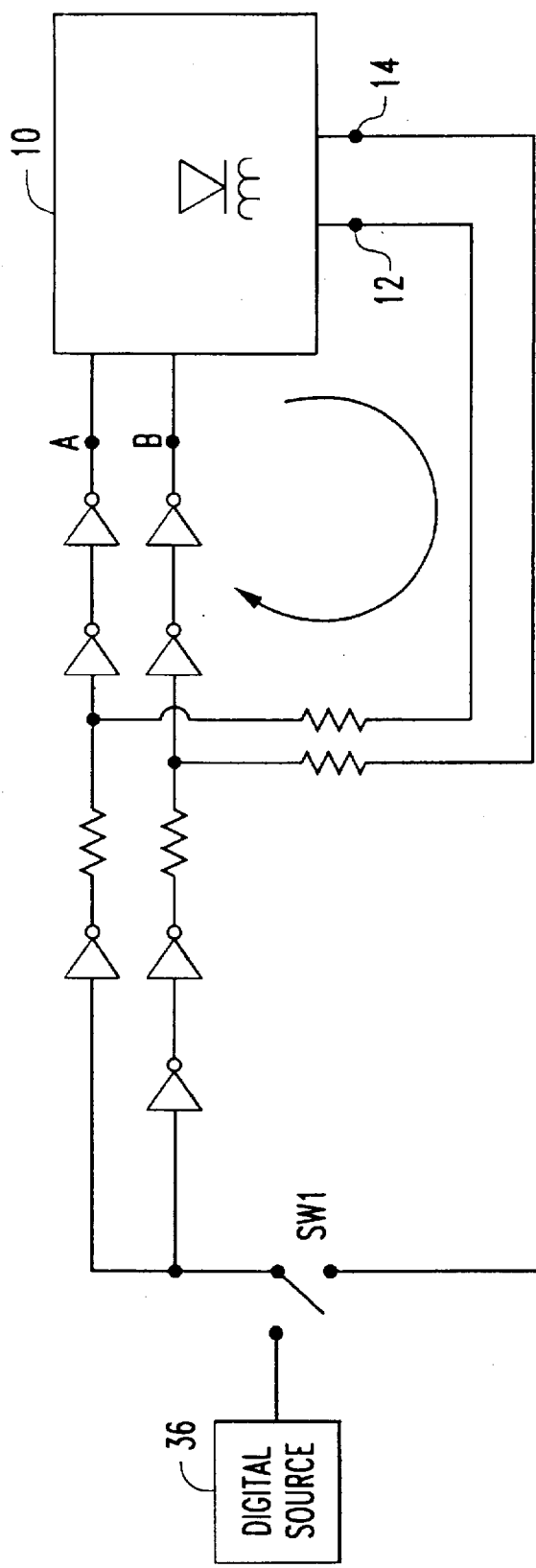
FIG. 3 is a partial circuit and partial block diagram of a second embodiment of the amplifier of the present invention.
Figure 3:
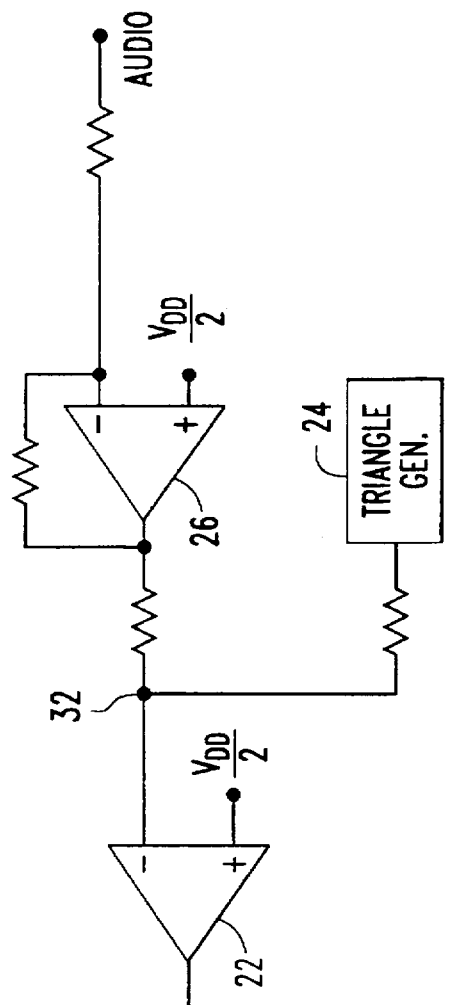
Figure 4:
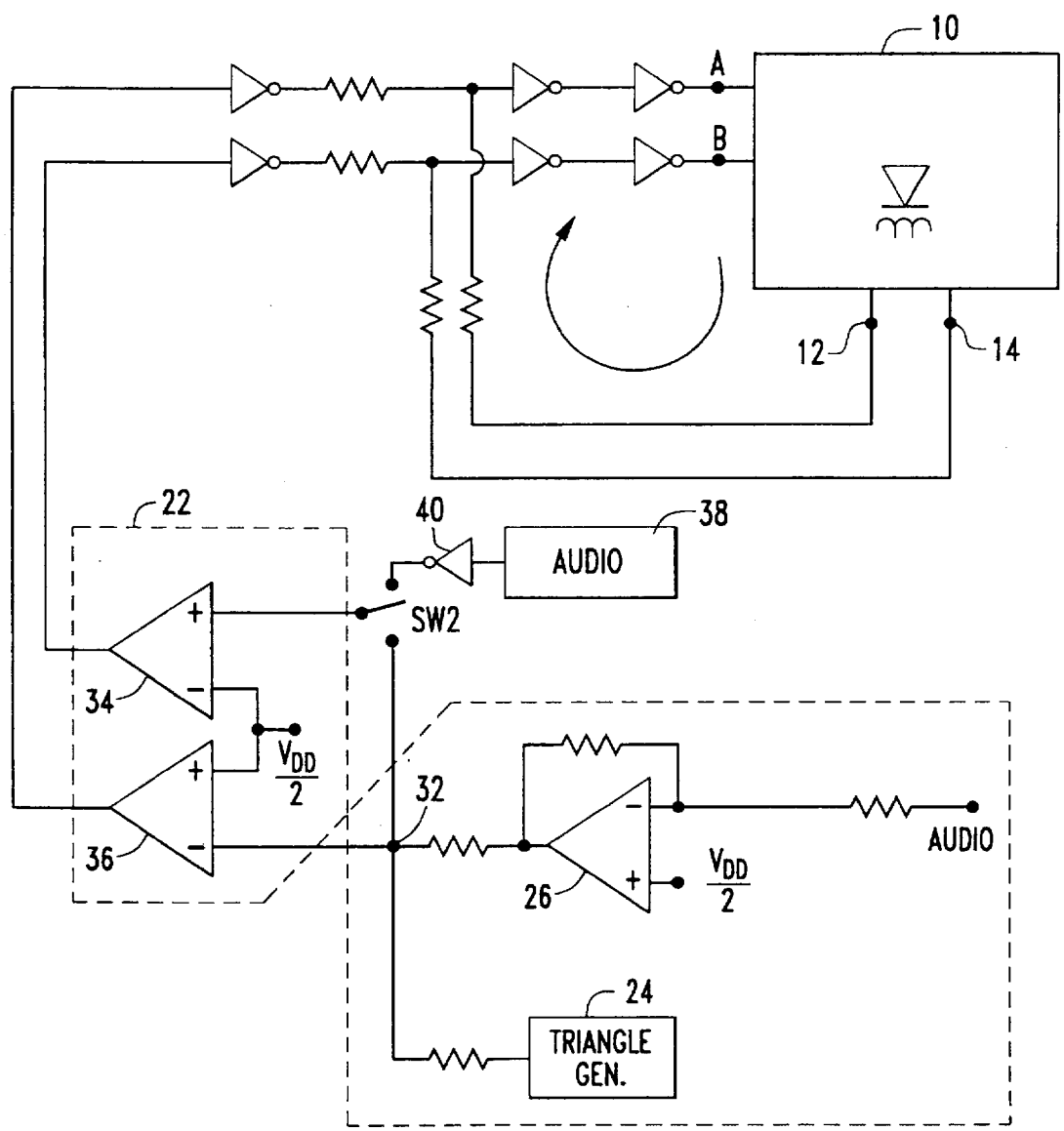
FIG. 4 is a partial circuit and partial block diagram of third embodiment of the amplifier of the present invention.

With reference to FIG. 3 and FIG. 4 where a second and third embodiments of the invention are illustrated, like circuit elements are again given like numerical designations to facilitate an understanding of the present invention.

In the embodiments of FIG. 3 and FIG. 4, the differential-to-single-ended-converter 16 of the prior art may also be removed from the feedback loop by treating each half of the bridge driver in the output circuit 10 as a separate channel.

In FIG. 3, all of the inverters are CMOS devices such as the Harris® CD 54/74 HCU04 inverter which typically has a gain of 16 or 24 dB. Because of the gain available with such inverters, the amplifier 30 may be eliminated. Such CMOS inverters may be used with the embodiments of the other figures, but generally are not required.

The use of CMOS inverters also permits the use of a digitally generated pulse width audio signal, suitably processed, as the input signal to the amplifier. As shown in FIG. 3, a suitable electronic switch may be used to substitute a digital source 36 such as a compact disc or CD for the illustrated audio amplifier 26 and modulator 22. The use of an additional inverter may be used to provide the complementary signals A and B to the output circuit 10.

Where differential input signal operation is desired, the digital source may provide two separate signals directly to the inverters at the input of the output circuit 10.

In FIG. 4, the pulse width modulated audio signal of the output terminal 32 is applied to two out of phase comparators 34 and 36 in a dual channel pulse width modulator 22 to thereby establish the complementary input signals A and B to the output circuit 10.

As shown in FIG. 4, the two channels may receive separate audio input signals. For example, the operation of the switch SW2 may provide a completely independent pulse width modulated audio source 38 as the input source for the comparator or modulator 34 within the modulator 22. The invertor 40 may of course be omitted with the reversal of the connections at the comparator 34. Similarly, the triangle waveform generator 24 needed for modulation may be common to both of the comparators 34 and 36 rather than associated with the audio sources as shown.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. A pulse width modulated digital audio amplifier having a continuous analog feedback loop which does not include an integrator.

2. The pulse width modulated audio amplifier of claim 1 wherein said continuous analog feedback loop does not include a modulator.

3. A pulse width modulated digital audio amplifier having a continuous analog feedback loop which does not include a modulator.

4. A pulse width modulated audio amplifier having an input terminal and an output terminal;

a source of an analog audio input signal;

means for pulse width modulating the output signal from said source to thereby provide a pulse width modulated digital signal in which the width of the pulses is related to the analog audio input signal;

a feedback circuit including an inverter; and a summing amplifier operatively connected to receive the output signals from said modulating means and from said inverter.

5. A pulse width modulated digital audio amplifier having an output terminal;

a source of a pulse width modulated digital audio input signal;

a resistive summing junction operatively connected to receive the signal from said source; and amplifying means including at least one invertor for connecting said summing junction to said output terminal.

6. The pulse width modulated audio digital amplifier of claim 5 wherein said audio source includes means for digitally generating a pulse width modulated audio digital signal.

7. The pulse width modulated audio digital amplifier of claim 5 wherein said audio source includes a source of an analog audio signal and means for pulse width modulating the digital output signal therefrom with the analog audio signal.

8. The pulse width modulated audio digital amplifier of claim 5 wherein said amplifier includes dual channels each having an input and output terminal;

wherein said amplifying means includes parallel signal paths each of which includes at least one CMOS invertor;

wherein said source includes means for providing two independent audio signals; and wherein said summing junction includes parallel paths connected respectively to one of said output terminals and to said source for receiving one of the audio signals therefrom.

9. A dual channel, pulse width modulated, audio digital amplifier having two output terminals;

a source of first and second audio input signals;

means for pulse width modulating the signals from said source; and feedback means including at least one invertor for each channel for summing the output signal from one of said output terminals with the output signal from one of said modulating means.

10. A method of reducing the distortion of a pulse width modulated, continuous analog feedback, audio digital amplifier comprising the step of eliminating all integration from the feedback path.

11. A method of reducing the distortion of a pulse width modulated, continuous analog feedback, audio digital amplifier comprising the step of eliminating all modulation from the feedback path.

12. The method of claim 11 including the further step of eliminating all integration from the continuous feedback path.

13. A method comprising the steps of:

(a) providing an analog audio input signal;

(b) pulse width modulating the analog audio input signal to provide a digital input signal in which the width of the pulses is related to the audio in the analog audio input signal;

(c) driving a speaker with a pulse width modulated digital output signal derived from the pulse width modulated digital input signal; and (d) summing the pulse width modulated digital output signal with the pulse width modulated input signal to correct non-linearities.

* * * * *